(12) United States Patent
Aoyagi

(10) Patent No.: US 7,344,971 B2
(45) Date of Patent: Mar. 18, 2008

(54) MANUFACTURING METHOD OF SEMICONDUCTOR DEVICE

(75) Inventor: Akiyoshi Aoyagi, Kanagawa (JP)

(73) Assignee: Seiko Epson Corporation (JP)

( * ) Notice: Subject to any disclaimer, the term of this patent is extended or adjusted under 35 U.S.C. 154(b) by 357 days.

(21) Appl. No.: 11/136,309

(22) Filed: May 24, 2005

(65) Prior Publication Data

US 2005/0266671 A1 Dec. 1, 2005

(30) Foreign Application Priority Data

May 26, 2004 (JP) ............... 2004-156269

(51) Int. Cl.
 *H01L 21/44* (2006.01)
(52) U.S. Cl. .................. 438/615; 438/612; 438/613; 257/E21.508
(58) Field of Classification Search ............ 438/612, 438/613, 615; 257/E21.508
See application file for complete search history.

(56) References Cited

U.S. PATENT DOCUMENTS 6,054,171 A * 4/2000 Shoji ..................... 438/106
6,887,778 B2 5/2005 Watanabe et al.
6,897,142 B2 5/2005 Fujimori et al.
2001/0025874 A1 10/2001 Nishiyama

FOREIGN PATENT DOCUMENTS

| JP | 06-013541 | 1/1994 |
| JP | 2001-284382 | 10/2001 |
| JP | 2003-100948 | 4/2003 |
| JP | 2004-103928 | 4/2004 |

OTHER PUBLICATIONS

Communication from Japanese Patent Office regarding corresponding application.

* cited by examiner

*Primary Examiner*—Asok Kumar Sarkar
(74) *Attorney, Agent, or Firm*—Harness, Dickey & Pierce, P.L.C.

(57) ABSTRACT

A manufacturing method of a semiconductor device comprises: (a) setting up a paste including a resin on an electrical connection part which is electrically connected to a semiconductor substrate; (b) setting up a soldering material above the electrical connection part so as to be in contact with the paste; and (c) forming an external terminal from the soldering material and forming a reinforcement from the paste by fusing the soldering material and the paste. The reinforcement exposes part of the external terminal and covers a periphery of an edge of a base connected to the electrical connection part of the external terminal.

9 Claims, 5 Drawing Sheets

MANUFACTURING METHOD OF SEMICONDUCTOR DEVICE

RELATED APPLICATIONS

This application claims priority to Japanese Patent Application No. 2004-156269 filed May 26, 2004 which is hereby expressly incorporated by reference herein in its entirety.

BACKGROUND

1. Technical Field

This invention relates to a manufacturing method of a semiconductor device.

2. Related Art

While it is important to relax effectively stress applied to an external terminal of a semiconductor device, according to a conventional method, reinforcement is formed around respective external terminals after forming a plurality of external terminals, thus making it difficult to apply partial reinforcement of the external terminals.

It is an object of the present invention to facilitate reinforcing partially the external terminal.

SUMMARY

A manufacturing method of a semiconductor device of the present invention, comprises: (a) setting up a paste including a resin on an electrical connection part coupled electrically to a semiconductor substrate; (b) setting up a soldering material over the electrical coupling part in contact with the soldering material; and (c) forming an external terminal by forming a reinforcement from the paste and fusing the soldering material and the paste. The reinforcement is formed such that part of the external terminal is exposed and a periphery of an edge of a base coupled to the electrical connection part of the external terminal is covered. According to the present invention, since the reinforcement is configured such as to cover the periphery of the edge of the base which is coupled to the electrical connection part of the external terminal, it is possible to relax effectively stress of the external terminal arising from thermal expansion or contraction. Further, a soldering material may be provided over the electrical connection part after the paste is provided on the electrical connection part, so that partial reinforcement of the external terminal may be made with ease.

In the manufacturing method of the semiconductor device, the paste may be set up in a manner of covering the entire electrical connection part in the step (a).

In the manufacturing method of the semiconductor device, the paste may be set up respectively over a plurality of the electrical coupling parts such that one paste is not in contact with another adjacent paste in the step (a).

In the manufacturing method of the semiconductor device, the paste may be set up integrally over the plurality of the electrical coupling parts in the step (a). According to this, the paste does not need to be set up for each electrical connection part, thus facilitating a paste forming process.

In the manufacturing method of the semiconductor device, the soldering material may be set up such as to be not in contact with the electrical connection part in the step (b).

A manufacturing method of a semiconductor device of the present invention, comprises: (a) attaching a paste including a resin to a soldering material; (b) providing the soldering material such that the paste is in contact with the electrical connection part which is electrically coupled to the semiconductor substrate; and (c) forming an external terminal from the soldering material and forming a reinforcement from the paste by fusing the soldering material and the paste. The reinforcement is formed such that part of the external terminal is exposed and a periphery of an edge of a base coupled to the electrical connection part of the external terminal is covered. According to the present invention, since the reinforcement is formed in a manner of covering the periphery of the edge of the base which is coupled to the electrical connection part of the external terminal, it is possible to relax effectively stress of the external terminal arising from thermal expansion or contraction. Also, a soldering material with paste is mounted, so that there are few steps of positioning to the electrical connection part, thus making the manufacturing process simple.

In the manufacturing method of the semiconductor device, the electrical connection part may be part of an interposer mounted on the semiconductor substrate.

In the manufacturing method of the semiconductor device, the electrical connection part may be part of a wiring layer extending over a resin layer formed on the semiconductor substrate.

In the manufacturing method of the semiconductor device, the paste may include a flux. According to this, wettability of the soldering material is enhanced so that an electrical connection between the external terminal and the electrical connection part may be properly achieved.

In the manufacturing method of the semiconductor device, the paste may include the soldering material. According to this, an electrical connection between the external terminal and the electrical connection part may be accomplished with certainty.

DETAILED DESCRIPTION

Embodiments of the present invention will be described below with reference to the drawings.

First Embodiment

Figure 1:
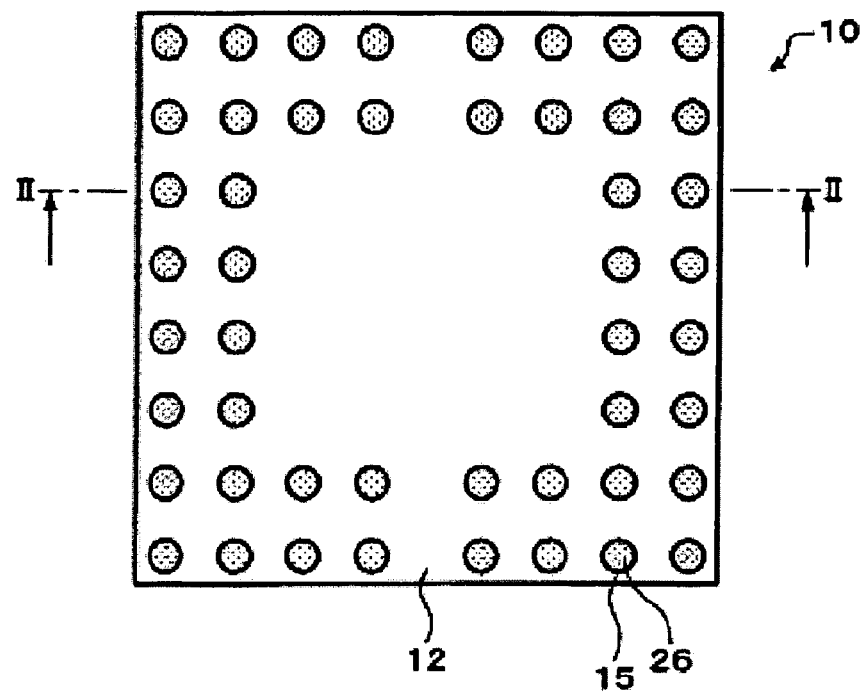
FIG. 1 is a diagram explaining a manufacturing method of a semiconductor device according to a first embodiment of the present invention.
Figure 2:
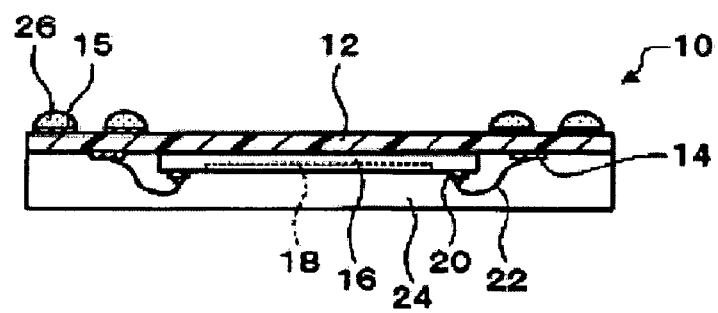
FIG. 2 is a sectional view along line II-II of FIG. 1.
Figure 3:
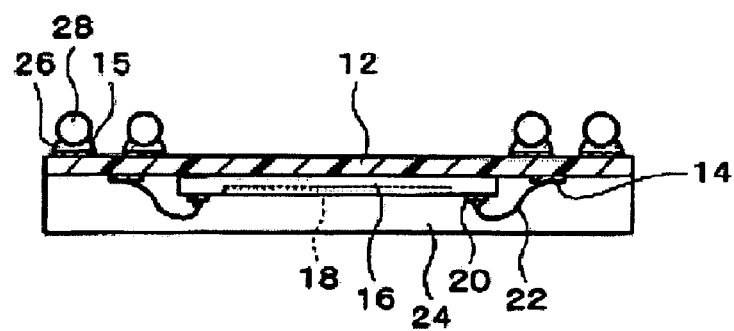
FIG. 3 is a diagram explaining a manufacturing method of a semiconductor device according to a first embodiment of the present invention.

FIGS. 1 to 4 are diagrams explaining a manufacturing method of a semiconductor device according to a first embodiment of the present invention. FIG. 2 is a sectional view along line II-II. A package 10 is made available in the present embodiment.

The package 10 has an interposer 12. The interposer 12 may be a substrate or a plate. The interposer 12 may be rectangular. The interposer 12 may be formed of a resin such as polyimide resin or formed of a mixed material of an organic material such as a resin and an inorganic material, or a metallic substrate or a ceramic substrate. In the interposer 12, there is formed a wiring pattern 14. The wiring pattern 14 may have wiring connecting a plurality of points electrically and an electrical connection part 15 with other parts. The electrical connection part 15 may be land. In the interposer 12, there may be formed an insulating layer (not illustrated) covering the wiring pattern 14 avoiding at least past of the electrical connection part 15. The wiring pattern 14 maybe formed on both sides of the interposer 12, so as to provide electrical connection through a thru hole not illustrated. The electrical connection part 15 may be formed on a side opposite to a surface on which a semiconductor chip 16 is mounted. The interposer 12 may be a multi-layer substrate or a build-up type substrate The package 10 has a semiconductor chip (semiconductor substrate) 16. An integrated circuit 18 is formed on the semiconductor chip 16. The semiconductor chip 126 is mounted on the interposer 12 and electrically connected to the wiring pattern 14. The semiconductor chip 16 may be bonded to the interposer 12 through an un-illustrated adhesive. As shown in FIG. 2, the semiconductor chip 16 may be subjected to face-up bonding to the interposer 12. In that case, a wire 22 may be bonded to a pad 20 of the semiconductor chip 16 and the wiring pattern 14.

The package 10 has a sealing part 24. The sealing part 24 seals the semiconductor chip 16 and seals the wire 22. The sealing part 24 is provided on the interposer 12. The sealing part 24 may be formed so as to overlap a plurality of the electrical coupling parts. The sealing part 24 may be formed of a resin (for example, a mold resin). The sealing part 24 may have a smaller rate of thermal expansion than the interposer 12.

On the electrical connection part 15 of such package 10, a paste 26 including a resin (for example, thermosetting resin). The paste 26 may be an adhesive. The paste 26 may include a flux or a soldering material. As the paste 26, what is called an underfill flux or an underfill paste may be used. The paste 26 may be mixed with all of a resin, a flux, and a soldering material. Or, the paste 26 may be mixed with a combination of a resin or a flux or a combination of a resin and a soldering material. The soldering material contained in the paste 26 may be the same material as a soldering material 28 for forming an external terminal which is to be explained later.

In an example shown in FIG. 1, respectively on a plurality of the electrical connection parts 15, the paste 26 is provided such that one part is not in contact with an adjacent part. From an area between adjacent electrical connection parts 15, the interposer 12 may be exposed. This enables an exposed area of the interposer 12 to be made wider so that it becomes easy for water vapor and the like to escape. The paste 26 may be provided such as to cover the entire electrical connection parts 15. If there is formed on the interposer 12 an insulating layer covering part of the electrical connection parts 15 (for example, edges surrounding a central portion), the paste 26 may be provided in a manner of covering the entire exposed portion of the electrical connection parts 15. Or the paste 26 may be provided to cover only part of the exposed portion of the electrical connection parts 15. For applying the paste 26, there may be applied any of a printing method (for example, screen printing), an imprinting method by a pin, a coating method by a dispenser, or a droplet ejection method (for example, inkjet method). Now, even if the paste 26 should include a soldering material (conductive material), since the soldering material remains in the electrical connection parts, electrical shorting between the adjacent parts of the electrical connection parts may be avoided.

Next, the soldering material 28 is set up on the electrical connection parts 15 so that it comes in contact with the paste 26. The soldering material 28 may be in a ball shape (solid shape). It may be formed of either soft solder or hard solder. For soft solder, solder including no lead (hereinafter referred to as "lead-free solder") may be used. For lead-free solder, a tin-silver (Sn—Ag) type, a tin-bismuth (Sn—Bi) type, a tin-zinc (Sn—Zn) type or a tin-copper (Sn—Cu) type may be used. Further to these alloys, at least one of the silver, bismuth, zinc, and copper may be added. The soldering material 28 may be a so-called solder ball.

The soldering material 28 may be set up so as to be not in contact with the electrical connection part 15. In that case, the paste 26 serves as a medium between the soldering material 28 and the electrical connection part 15. Or, the soldering material 28 may be set up such as to be in contact with the electrical connection part 15. The soldering material 28 may be set up in contact with one electrical connection part 15. One soldering material 28 is setup on one electrical connection part 15. Also, if necessary, a flux is attached to the soldering material 28 and the soldering material 28 with flux may contact the paste 26. In that case, the paste 26 may not include a flux.

Thereafter, the paste 26 and the soldering material 28 are fused. By carrying out a heating process, the paste 26 and the soldering material 28 may be fused. The heating process may be a heating treatment (for example, a heat treatment of about 240° C.) for a re-flow process of the soldering material 28. If the paste 26 includes a thermosetting resin, it is preferable for the paste 26 not to harden before the soldering material 26 starts fusing. The heating process may include a heat treatment (lower temperature and longer heat treatment than the re-flow process) for the hardening process of a resin after the re-flow process.

Figure 4:
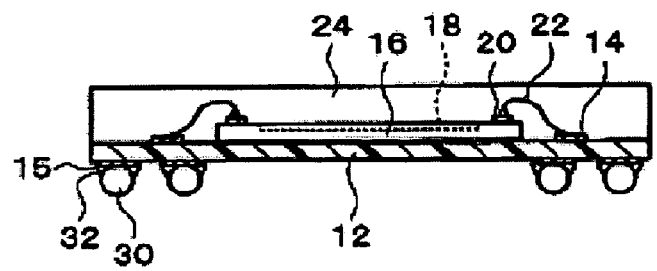
FIG. 4 is a diagram explaining a manufacturing method of a semiconductor device according to a first embodiment of the present invention.

In this manner, as shown in FIG. 4, an external terminal 30 is formed from the soldering material 28 and a reinforcement 32 is formed from the paste 26. The edge of the base of the external terminal 30 is connected to the electrical connection part 15 (part of the interposer 12). The external terminal 30 has an intermediate portion having the largest sectional shape, and the edge of the base connected to the electrical connection part 15 has a smaller sectional shape than its intermediate portion. The external terminal 30 may form part of a substantially spherical body.

The reinforcement 32 exposes part of respective external terminals 30 (portion including a tip) and covers the periphery of the edge of the base connected to the electrical connection part 15 of respective external terminals 30. Of the external terminal 30, an exposed portion from the reinforcement 32 may be (only) the tip opposite to the edge of the base of the external terminal 30 or a portion (more than half the one side) continuing from the intermediate portion of the external terminal 30 to the tip. The reinforcement 32 may cover the entire periphery of the edge of the base connected to the electrical connection part 15 of the external terminal 30. The reinforcement 32 may spread to over the insulation layer mounted on the edge of the electrical connection part 15.

The reinforcement 32 is provided such that each electrical connection part 15 is set up for adjacent parts not to be in contact with each other. The reinforcement 32 may avoid being between adjacent external terminals 30. The interposer 12 may expose from an area between adjacent external terminals 30

If the reinforcement 32 (paste 26) is an adhesive, the periphery of the external terminal 30 can be bonded and reinforced. If the reinforcement 32 (paste 26) includes a flux, it is possible to carry out electrical connection between the external terminal 30 and the electrical connection part 15 properly by enhancing wettability of the soldering material 28 which is a material of the external terminal 30. If the reinforcement 32 (paste 26) includes a soldering material, it is possible to accomplish the electrical connection between the external terminal 30 and the electrical connection part 15 with certainty.

According to the present embodiment, since the reinforcement 32 is formed so as to cover the periphery of the edge of the base which is connected to the electrical connection part 15 of the external terminal 30, it is possible to relax effectively stress of the external terminal. 30 arising from thermal expansion or contraction. Also, a soldering material 28 may be set up over the electrical connection part 15 after the paste 26 which is to be a reinforcement is provided on the electrical connection part 15, so that partial reinforcement of the external terminal 30 may be achieved with ease.

Figure 5:
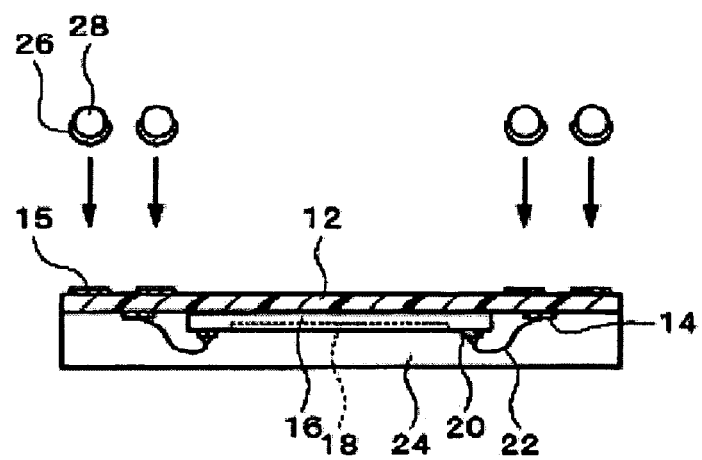
FIG. 5 is a diagram explaining a manufacturing method of a semiconductor device according to an example of variation of a first embodiment of the present invention.

FIG. 5 is a diagram explaining an example of variation of the present embodiment. In the present example of variation, The paste 26 is adhered to the soldering material 28 in advance. For example, a plurality of soldering materials 26 in a ball shape are immersed in a solution including the paste 26 so that the paste 26 adheres to the soldering material 28. The paste 26 may be made to adhere to part of the soldering material 28. Thereafter, the soldering material 28 attached with the paste 26 is set up on the electrical connection part 15 so that the paste 26 may come in contact with the electrical connection part 15. And by fusing the paste 26 and the soldering material 28, the external terminal is formed from the soldering material 28 and the reinforcement is formed from the paste 26 (refer to FIG. 4). According to this, since the soldering material 28 with the paste 26 is mounted, there are few steps of positioning with respect to the electrical connection part 15 and the manufacturing process is simple.

Figure 6:
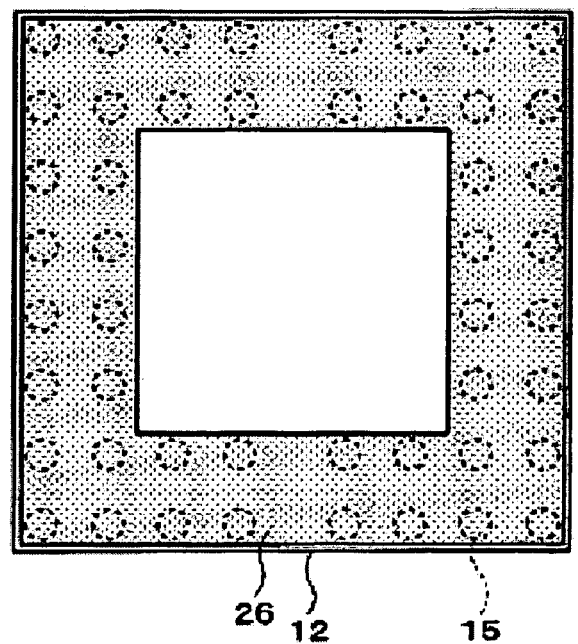
FIG. 6 is a diagram explaining a manufacturing method of a semiconductor device according to an example of variation of a first embodiment of the present invention.

FIG. 6 is a diagram explaining the example of variation of the present embodiment. In the present example of variation, the paste 26 is provided integrally over a plurality of the electrical connection parts 15. On all or part (over 2) of the electrical connection parts 15 of the plurality of the electrical connection parts 15 formed on one interposer 12, it is integrally provided. The paste 26 may be provided avoiding part (central portion in FIG. 6) of the interposer 12 or set up over the entire surface of the interposer 12. According to this; the paste 26 does not need to be set up at respective electrical connection parts 15, hence, the forming process of the paste 26 is made easy.

Now, other details of the above-mentioned example of variation include contents which can be drawn from the contents explained in the above embodiment.

Second Embodiment

Figure 7:
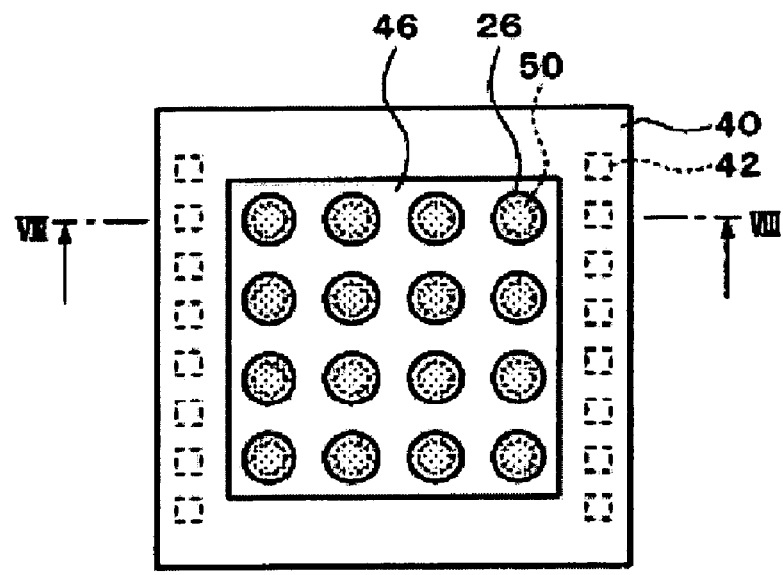
FIG. 7 is a diagram explaining a manufacturing method of a semiconductor device according to a second embodiment of the present invention.
Figure 8:
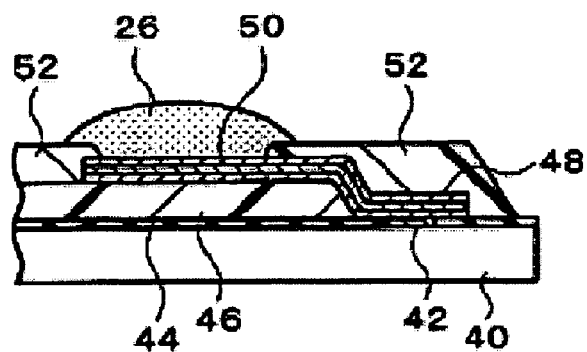
FIG. 8 is a sectional view along line VIII-VIII of FIG. 7.
Figure 9:
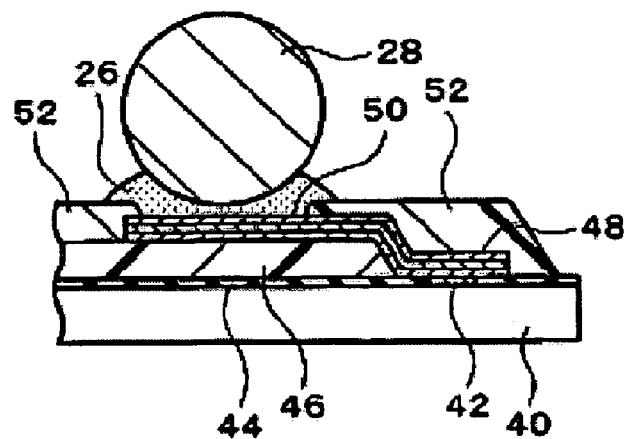
FIG. 9 is a diagram explaining a manufacturing method of a semiconductor device according to a second embodiment of the present invention.
Figure 10:
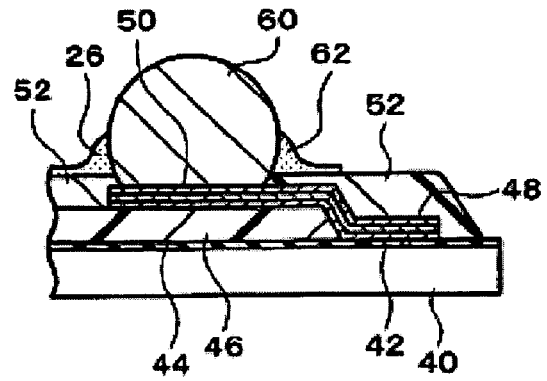
FIG. 10 is a diagram explaining a manufacturing method of a semiconductor device according to a second embodiment of the present invention.

FIGS. 7 to 11 are diagrams explaining a manufacturing method of a semiconductor device according to a second embodiment of the present invention. In FIG. 7, part of what constitutes the semiconductor device (wiring layer and the like) is omitted. FIG. 8 is a sectional view along line VIII-VIII in FIG. 7. In the present embodiment, a semiconductor wafer (semiconductor substrate) 40 is made available. In FIG. 7, part of the semiconductor wafer (to be specific, an area corresponding to a semiconductor chip) is shown. As an example of variation, a manufacturing method to be explained now may be applied in regard to the semiconductor chip obtained by sectioning the semiconductor wafer into pieces.

On the semiconductor wafer 40, there are formed a plurality of integrated circuits (not illustrated) with formation of a plurality of electrodes 42 for respective integrated circuits. The electrode 42 is formed on the side of a surface on which the integrated circuit of the semiconductor wafer 40 is formed. On the semiconductor wafer 40, there may be formed a passivation film 44 avoiding part of the electrode 42.

On the semiconductor wafer 40, there is formed a resin layer 46. The resin layer 46 has a stress relaxing function and is formed avoiding the electrode 42 of the semiconductor wafer 40. The resin layer 46 may be formed of a polyimide resin, a silicon denatured polyimide resin, an epoxy resin, a silicon denatured epoxy resin, BCB (benzocyclobutene), PBO (polybenzoxazole) and the like. The resin layer 46 may be subjected to patterning by using photolithography. The resin layer 46 may be formed in a plurality of areas avoiding a space between adjacent portions.

On the semiconductor wafer 40, there is formed a wiring layer 48 which is connected electrically to the electrode 42. The wiring layer 48, extending over the resin layer 46, has an electrical connection part 50 over the resin layer 46. The electrical connection part 50 is part of the wiring layer 48. The electrical connection part 50 may be land. It is acceptable for a plurality of the electrical connection parts 50 to be arrayed in a plurality of rows and a plurality of columns in a flat area of the: resin layer 46. Now, an insulating layer 52 covering the wiring layer 48 is formed on the semiconductor wafer 40 avoiding part (for example, the central portion) of the electrical connection part 50. The insulating layer 52 may be a photoresist from a soldering material (for example, a solder photoresist).

On the electrical connection part 50 of such semiconductor wafer 40, the paste 26 is set up. The paste 26 may be set up on each of a plurality of the electrical connection parts 50 such that the adjacent parts may be not in contact with each other. Or, as explained in the example of variation of the first embodiment, it may be integrally set up over the plurality of the electrical connection parts 50. The soldering material 28 is provided on the paste 26, and by fusing them, an external terminal 60 and a reinforcement 62 are formed. For other details, there are included contents which can be drawn from the contents explained in the first embodiment.

Other Embodiments

FIGS. 11 to 14 are diagrams explaining other embodiments of the present invention. These semiconductor devices form the external terminal 30 and the reinforcement 32 on part (electrical connection part 15) of the interposer 12.

Figure 11:
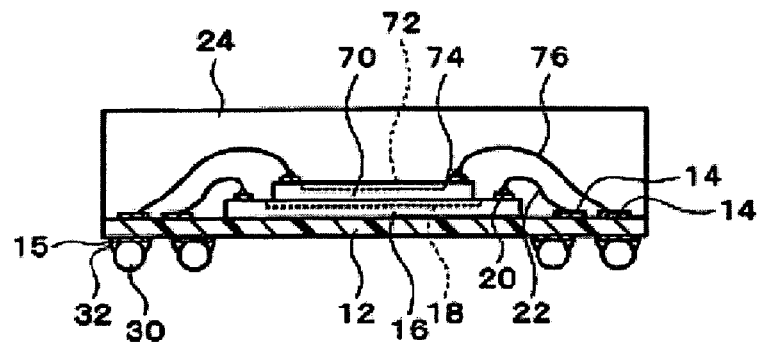
FIG. 11 is a diagram showing a semiconductor device manufactured by a method according to other embodiment of the present invention.

As shown in FIG. 11, a plurality of semiconductor chips 16 and 70 may be stacked on the interposer 12. To be specific, the semiconductor chip 16 is subjected to face-up bonding on the interposer 12, and further, the semiconductor chip 70 may be subjected to face-up bonding on the semiconductor chip 16. A pad 74 which will become an integrated circuit 72 and an electrode are formed on the semiconductor chip 70, and the pad 74 and the wiring pattern 14 are bonded by a wire 76. Contents of what is explained about the above-mentioned semiconductor chip 16 correspond to the details of the semiconductor chip 70. The sealing part 24 seals the plurality of semiconductor chips 16 and 70. And, the external terminal 30 and the reinforcement 32 may be formed on the electrical connection part 15 of such a package.

Figure 12:
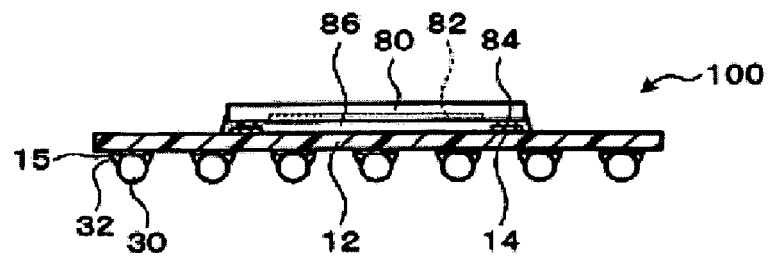
FIG. 12 is a diagram showing a semiconductor device manufactured by a method according to other embodiment of the present invention.

As shown in FIG. 12, on the interposer 12, a semiconductor chip 80 may be subjected to face-down bonding. The semiconductor chip 80 is bonded to the interposer 12 through an adhesive 86. The adhesive 86 may be energy-setting (thermosetting, ultraviolet-ray setting and the like). The adhesive 86 may be electrically insulating. A bump 84 which will become an integrated circuit 82 and an electrode is formed on the semiconductor chip 89. By placing the bump 84 and the wiring pattern 14 opposite to each other, one may be electrically connected to the other. If the adhesive 86 is an anisotropic conductive material (anisotropic conductive film, anisotropic conductive paste and the like), it is possible to obtain electrical connection through conductive molecules. If the adhesive 86 is an insulating adhesive, its power of contraction may be used for cold welding of the bump 84 to the wiring pattern 14. Or the bump 84 and the wiring pattern 14 may be subjected to metal jointing. The electrical connection part 15 which is part of the wiring pattern 14 is formed on an opposite side to a surface on which the semiconductor chip 80 is mounted. The external terminal 30 and the reinforcement 32 may be formed on the electrical connection part 15 of such a package.

Figure 13:
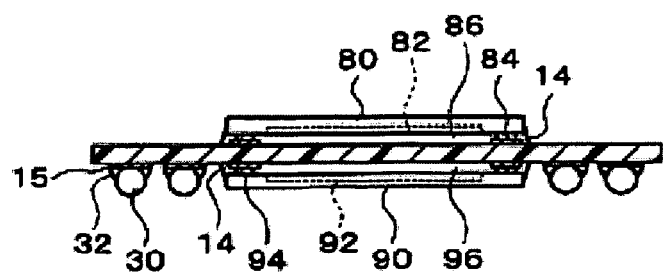
FIG. 13 is a diagram showing a semiconductor device manufactured by a method according to other embodiment of the present invention.

As shown in FIG. 13, semiconductor chips 80 and 90 may be mounted on both surfaces of the interposer 12. The semiconductor chip 90 may have formation of a bump 94 consisting of an integrated circuit 92 and an electrode, and by setting the bump 94 and the wiring pattern 14 opposite to each other, both may be electrically connected. Contents of what is explained about the above-mentioned adhesive 86 correspond to the details of the adhesive 96. The electrical connection part 15 which is part of the wiring pattern 14 is formed on either surface of the interposer 12. The external terminal 30 and the reinforcement 32 may be formed on the electrical connection part 15 of such a package.

Figure 14:
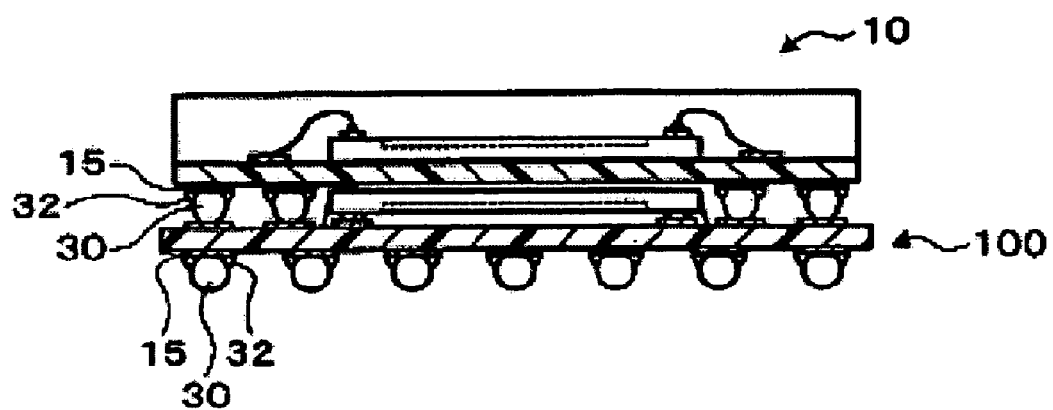
FIG. 14 is a diagram showing a semiconductor device manufactured by a method according to other embodiment of the present invention.

As shown in FIG. 14, the above-mentioned packages 10 and 100 may be stacked. There is a medium of the external terminal 30 in between the package 10 and the package 100, and the external terminal 30 is reinforced by the reinforcement 32. According to this, since part of the external terminal 30 is exposed from the reinforcement 32 between the package 10 and the package 100, there is formed a space to let water vapor and the like to escape, thus making it possible to prevent the first and the second packages 10 and 30 from peeling due to residual water vapor and the like. Consequently, stress upon the external terminal 30 can be relaxed. Now, the electrical connection part 15 is formed on a surface facing the outside of the interposer placed on the outermost side, and the external terminal 30 and the reinforcement 32 may be formed on its electrical connection part 15.

The present invention is not limited to the above-mentioned embodiments, and many variations are possible. For example, the present invention includes virtually the same constitution (for example, the same constitution of function, method and result, or the same constitution of object and result) as the constitution explained in the embodiments. Also, the present invention includes constitution in which a part that is not essential of the constitution explained in the embodiments is substituted. Further, the present invention includes constitution such as the constitution performing the same operation/working-effect as the constitution explained in the embodiments or the constitution capable of achieving the same object.

Still further, the present invention includes constitution in which publicly known techniques are added to the constitution explained in the embodiments.

What is claimed is:

1. A manufacturing method of a semiconductor device, comprising:
   (a) forming an insulation layer on a semiconductor substrate that partially covers a top surface of an electrical connection part coupled electrically to a semiconductor substrate, the insulation layer partially exposing the top surface of the electrical connection part;
   (b) setting up a paste including a resin on the top surface of the electrical connection part such that the paste at least partially covers the insulation layer;
   (c) setting up a soldering material over the electrical connection part in contact with the paste; and
   (d) forming an external terminal from the soldering material and forming a reinforcement from the paste by fusing the soldering material and the paste, wherein the reinforcement is formed such that part of the external terminal is exposed and a periphery of an edge of a base coupled to the electrical connection part of the external terminal is covered by the reinforcement.

2. The manufacturing method of the semiconductor device according to claim 1, wherein the paste is set up in a manner of covering the entire top surface of the electrical connection part exposed by the insulation layer in the step (b).

3. The manufacturing method of the semiconductor device according to claim 1, wherein the paste is set up respectively on a plurality of the electrical connection parts such that one paste is not in contact with another adjacent paste in the step (b).

4. The manufacturing method of the semiconductor device according to claim 1, wherein the paste is set up integrally over the plurality of the electrical connection parts in the step (b).

5. The manufacturing method of the semiconductor device according to claim 1, wherein the soldering material is set up such as to be not in contact with the electrical connection part in the step (c).

6. The manufacturing method of the semiconductor device according to claim 1, wherein the electrical connection part is part of an interposer mounted on the semiconductor substrate.

7. The manufacturing method of the semiconductor device according to claim 1, wherein the electrical connection part is part of a wiring layer extending over a resin layer formed on the semiconductor substrate.

8. The manufacturing method of the semiconductor device according to claim 1, wherein the paste includes the flux.

9. The manufacturing method of the semiconductor device according to claim 1, wherein the paste includes the soldering material.

* * * * *